United States Patent [19]
Oae et al.

[11] Patent Number: 5,180,919
[45] Date of Patent: Jan. 19, 1993

[54] ELECTRON BEAM EXPOSURE SYSTEM HAVING THE CAPABILITY OF CHECKING THE PATTERN OF AN ELECTRON MASK USED FOR SHAPING AN ELECTRON BEAM

[75] Inventors: Yoshihisa Oae; Kiichi Sakamoto; Hiroshi Yasuda, all of Kawasaki, Japan

[73] Assignee: Fujitsu Limited, Kawasaki, Japan

[21] Appl. No.: 761,454

[22] Filed: Sep. 18, 1991

[30] Foreign Application Priority Data

Sep. 18, 1990 [JP] Japan .................................. 2-249503

[51] Int. Cl.$^5$ ............................................. H01J 37/30
[52] U.S. Cl. ................................. 250/492.2; 250/297; 250/398
[58] Field of Search ........... 250/492.2, 492.22, 492.23, 250/398, 397

[56] References Cited

U.S. PATENT DOCUMENTS

4,578,587 3/1986 Behringer et al. ................ 250/492.2
5,061,851 10/1991 Noguchi .............................. 250/397

Primary Examiner—Jack I. Berman
Attorney, Agent, or Firm—Staas & Halsey

[57] ABSTRACT

An electron beam exposure system having a capability of checking a pattern to be written on an object comprises an electron beam source for producing an electron beam along an optical axis toward the object, a block mask provided on the optical axis and having selectable aperture patterns therein for correspondingly shaping the electron beam, an addressing deflector fixture for selectively passing the electron beam through a desired aperture on the block mask, an electron optical system for focusing the electron beam shaped by the block mask on the object such that an image of the aperture of the block mask is projected on the object, a screen provided along the optical axis between the block mask and the object for interrupting the electron beam when the electron beam is offset from the alignment with the optical axis, the screen having a throughhole in alignment with the optical axis for passing the electron beam therethrough a controller for controlling the electron optical system such that an image of the aperture of the beam shaping means through which the electron beam has passed is projected on the screen when checking the pattern of the apertures on the block mask, and a detection unit for detecting the image of the aperture that is projected on the screen.

9 Claims, 11 Drawing Sheets

FIG.10 ns ELECTRON BEAM EXPOSURE SYSTEM HAVING THE CAPABILITY OF CHECKING THE PATTERN OF AN ELECTRON MASK USED FOR SHAPING AN ELECTRON BEAM

BACKGROUND OF THE INVENTION

The present invention relates in general to fabrication of semiconductor devices and in particular to an electron beam exposure system for writing a semiconductor pattern on a semiconductor substrate by an electron beam.

In the submicron patterning of semiconductor devices, the electron beam exposure system is suitable. The electron beam exposure system uses a finely focused electron beam for writing a semiconductor pattern on a semiconductor substrate and can achieve the resolution of less than 1 $\mu$m without difficulty. On the other hand, the conventional electron beam exposure system has suffered from the problem of relatively low throughput because of the basic constraint of the system in that the semiconductor pattern is written in one stroke of the focused electron beam.

In order to improve the problem of low throughput, a technique of so-called block exposure is proposed. According to this procedure, the electron beam is shaped into a desired one of fundamental patterns of several, selectable semiconductor devices and the desired semiconductor pattern is written on the substrate as a consecutive repetition of "shots" of selected fundamental patterns. This block exposure technique is particularly suited for the fabrication of semiconductor devices such as memories in which a repetition of fundamental patterns is included.

Figure 1:
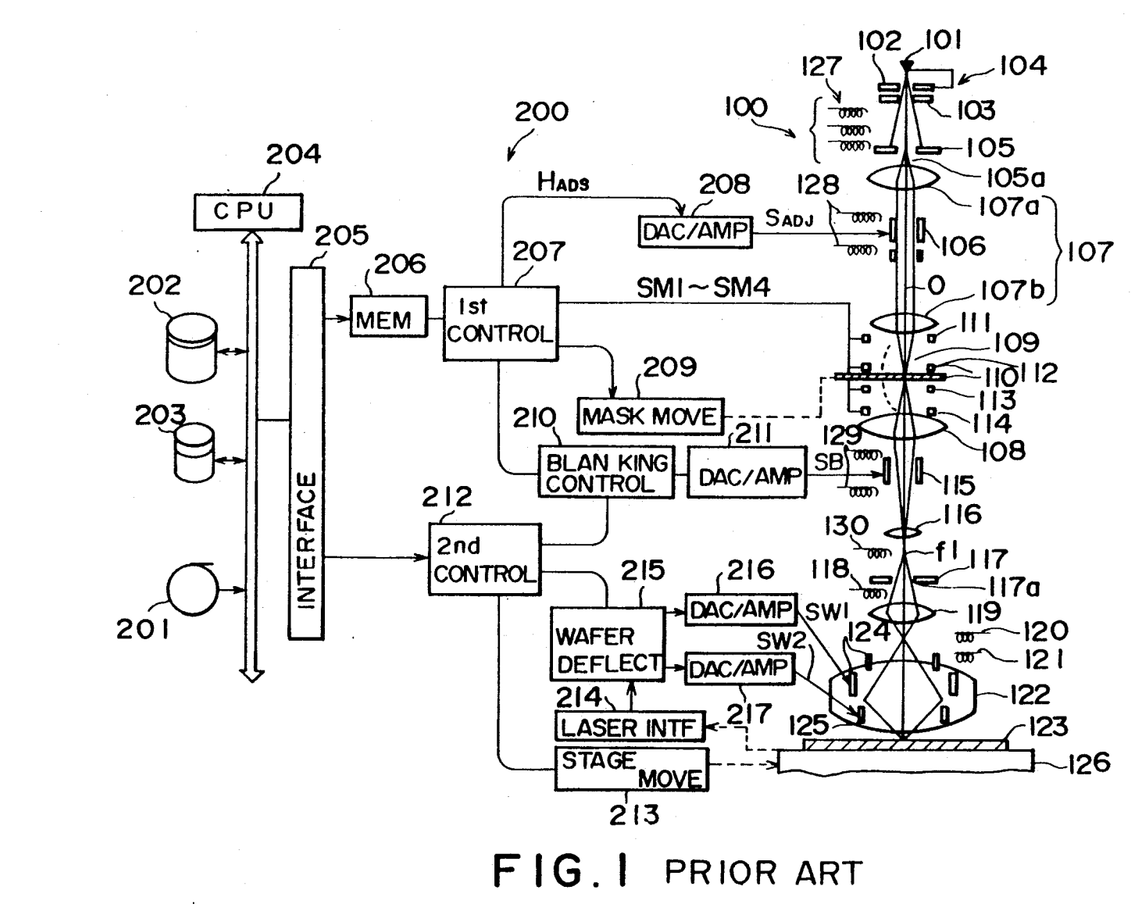
FIG. 1 is a diagram showing an overall construction of a conventional electron beam exposure system that uses the block exposure process.

FIG. 1 shows the construction of a conventional electron beam exposure system that uses the technique of block exposure. Referring to the drawing, the electron beam exposure system generally comprises an electron optical system 100 for producing and focusing an electron beam and a control system 200 for controlling the optical system 100.

The electron optical system 100 includes an electron gun 104 as a source of the electron beam. The electron gun 104 includes a cathode electrode 101, a grid electrode 102 and an anode electrode 103, and produces the electron beam generally in the direction of a predetermined optical axis O in the form of a spreading beam.

The electron beam thus produced by the electron gun 104 is passed through a shaping aperture 105a formed in an aperture plate 105. The aperture plate 105 is provided such that the aperture 105a is in alignment with the optical axis O and shapes the incident electron beam to have a rectangular cross section.

Figure 2:
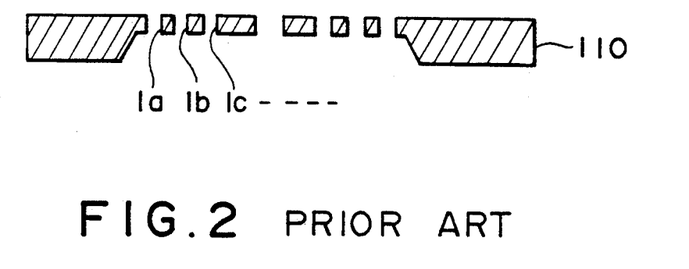
FIG. 2 is a cross sectional view of a block mask used in the system of FIG. 1.

The electron beam thus shaped is received by an electron lens 107a that has a focal point coincident with the aperture 105a. Thereby, the incident electron beam is converted to a parallel beam and enters into an electron lens 107b that focuses the electron beam on a block mask 110. It should be noted that the lens 107b projects the image of the rectangular aperture 105a on the block mask 110. As shown in FIG. 2, the block mask 110 carries a number of fundamental patterns 1a, 1b, 1c, ... of the semiconductor device pattern to be written on the substrate in the form of apertures, and shapes the electron beam according to the shape of the aperture through which the electron beam has passed.

In order to deflect the electron beam passed through the electron lens 107b and address the desired aperture, deflectors 111, 112, 113 and 114 are provided, wherein the deflector 111 deflects the electron beam away from the optical axis O in response to a control signal SM1. The deflector 112 in turn deflects back the electron beam generally in parallel to the optical axis O in response to a control signal SM2. After passing through the block mask 110, the deflector 113 deflects the electron beam toward the optical axis O in response to a control signal SM3, and the deflector 114 deflects the electron beam such that the electron beam travels coincident to the optical axis O in response to a control signal SM4. Further, the block mask 110 itself is movable in the direction perpendicular to the optical axis O for enabling the addressing of the apertures on the entire surface of the block mask 110 by the electron beam.

The electron beam thus passed through the block mask 110 is then focused at a point f1 that is located on the optical axis O after passing through electron lenses 108 and 116. There, the image of the addressed aperture on the block mask 110 is demagnified at the point f1. The electron beam thus focused is then passed through a blanking aperture 117a formed in a blanking plate 117 and further focused on the surface of a substrate 123 that is held on a movable stage 126, after passing through electron lenses 119 and 120 that form another demagnifying optical system. There, the electron lens 120 serves for an objective lens and includes various coils such as correction coils 120 and 121 for focusing compensation and astigmatic compensation as well as deflection coils 124 and 125 for moving the focused electron beam over the surface of the substrate 123.

It should be noted that the foregoing blanking aperture 117a is provided coincident to the optical axis O for establishing an alignment of the electron beam therewith. For this purpose, various adjustment coils 127-130 are provided. Thus, at the beginning of the exposure, the electron beam is turned on and the arrival of the electron beam at the stage 126 is detected while controlling the adjustment coils 127-130. During this procedure, the mask 110 may be removed from the optical path O for free passage of the electron beam. Alternatively, a large aperture formed in the mask 110 for passing the electron beam freely may be used.

In FIG. 1, it should be noted that the illustrated state represents the operational state of the electron beam exposure system wherein the electron beam is focused at the surface of the substrate 123. In this state, the focusing point f1 of the optical system formed of the lenses 108 and 116 is located above the blanking aperture plate 117 for achieving the desired demagnification.

In order to control the exposure operation, the electron beam exposure system of FIG. 1 includes the control system 200, wherein the control system 200 includes memory devices such as a magnetic tape device 201 and magnetic disk devices 202, 203 that are provided to store various data of the device pattern of the semiconductor device to be written. In the illustrated example, the magnetic tape device 201 is used for storing various design parameters, the magnetic disk device 202 is used for storing the exposure pattern data, and the magnetic disk device 203 is used for storing the pattern of the apertures on the block mask 110.

The data stored in the memory devices is read out by a CPU 204 and transferred to an interface device 205 after data decompression. There, the data for specifying the pattern on the block mask 110 is extracted and stored in a data memory 206. The data stored in the data memory 206 is then transferred to a first control unit 207 that produces the foregoing control signals SM1-4 and supplies the same to the deflectors 111-114. Further, the control unit 207 produces and supplies a control signal to a mask moving mechanism 209 that moves the block mask 110 in the direction transverse to the optical path O. In response to the deflection of the optical beam by the deflectors 111-114 and further in response to the lateral movement of the block mask 110, one can address the desired aperture on the mask 110 by the electron beam.

The first control unit 207 further supplies a control signal to a blanking control unit 210 that in turn produces a blanking signal for shutting off the electron beam. This blanking signal is then converted to an analog signal SB in a D/A converter 211 and the analog signal SB is supplied to a deflector 115 that causes a deflection of the electron beam away from the optical axis O. In response to this, the electron beam misses the blanking aperture 117a and disappears from the surface of the substrate 123. Further, the control unit 207 produces a pattern correction data $H_{ADJ}$ and supplies the same to a D/A converter 208. The D/A converter 208 in turn produces a control signal $S_{ADJ}$ and supplies the same to a deflector 106 that is provided between the electron lens 107a and the electron lens 107b. Thereby, one can modify the shape of the electron beam that has passed through the addressed aperture in the mask 110. This function is used when the desired shape of the electron beam is different from the shape given by the apertures on the block mask 110.

The interface device 205 further extracts and supplies the data for controlling the movement of the electron beam on the surface of the substrate 123 to a second control unit 212. In response thereto, the control unit 212 produces a control signal for controlling the deflection of the electron beam on the surface of the substrate 123 and supplies the same to a wafer deflection control unit 215 that in turn produces and supplies deflection control signals to D/A converters 216 and 217. The D/A converters 216 and 217 in turn produce drive signals SW1 and SW2 for driving the deflectors respectively and supply the sam to the deflectors 124 and 125 for causing the deflection of the electron beam. Thereby, the position of the stage 126 is detected by a laser interferometer 214 and the wafer deflection control unit 215 modifies the output deflection control signals and hence the drive signals SW1 and SW2 according to the result of measurement of the stage position by the laser interferometer. Further, the second control unit 212 produces a control signal that causes a lateral movement of the stage 126.

In such a conventional block exposure system, there arises often a need for checking whether the pattern of the apertures on the block mask 110 is defect-free or not. As the size of each pattern on the block mask 110 is in the order of several hundred microns, and as there are tens and hundreds of apertures provided on the mask 110, there is a substantial risk that one or more of these apertures may be defective. Such a defect may be caused at the time of the fabrication process of the block mask 110 or during the use of the block mask 110, in which the thin membrane of the block mask 110 is deformed by the energy of the electron beam. Thus, it is necessary to conduct a checking of the block mask 110 prior to the exposure process. Further, such a checking routine may be made with a regular interval during the exposure process.

Conventionally, such a checking of the aperture pattern of the block mask 110 has been done by a microscopic observation. There, the block mask 110 is dismounted from the optical system 100 of the electron exposure system and brought under the optical microscope. However, such a checking routine is time-consuming and increases the risk of the block mask 110 being damaged particularly during the dismounting and mounting process. Further, such a conventional checking process cannot detect any dirts that have been deposited on the mask 110 after the microscopic observation.

SUMMARY OF THE INVENTION

Accordingly, it is a general object of the present invention to provide a novel and useful electron beam exposure system, in which the foregoing problems are eliminated.

Another and more specific object of the present invention is to provide an electron beam exposure system that has the capability of checking the aperture patterns formed on a block mask without dismounting the block mask from the electron beam exposure system.

Another object of the present invention is to provide an electron beam exposure system having a block mask on which a plurality of apertures are formed for shaping an electron beam that is passed therethrough, wherein the electron beam exposure system comprises focusing means for forming an image of the aperture on a screen which is provided on the optical axis of the system and which carries a blanking aperture, and detection means for detecting the image formed on said screen. According to the present invention, one can achieve the desired checking of the pattern of the apertures in the block mask without dismounting the block mask from the optical system of the electron beam exposure system.

Other objects and further features of the present invention will become apparent from the following detailed description when read in conjunction with the attached drawings.

DETAILED DESCRIPTION

Figure 3:
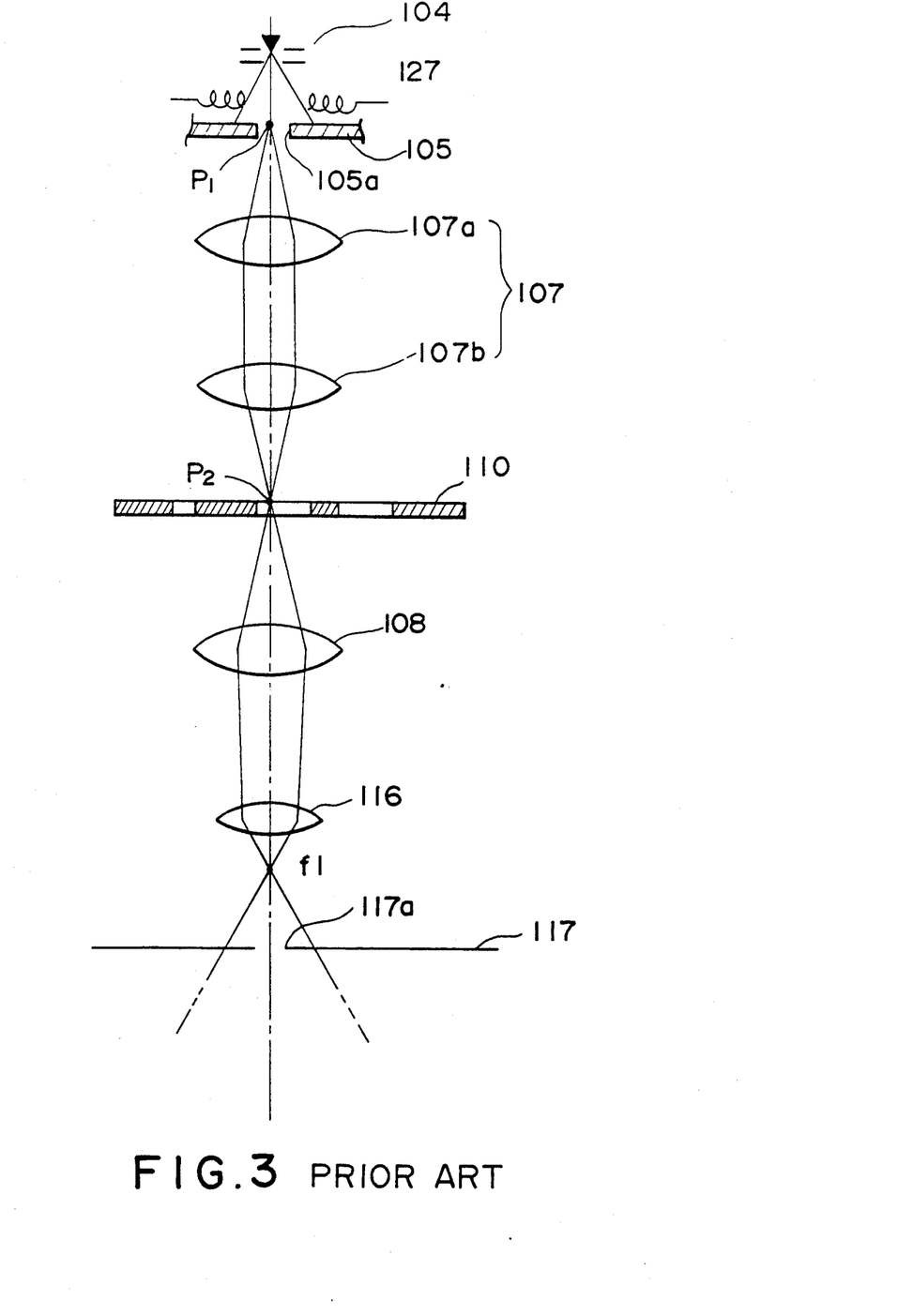
FIG. 3 is a schematic diagram showing the focusing of an electron beam achieved in the system of FIG. 1.
Figure 4:
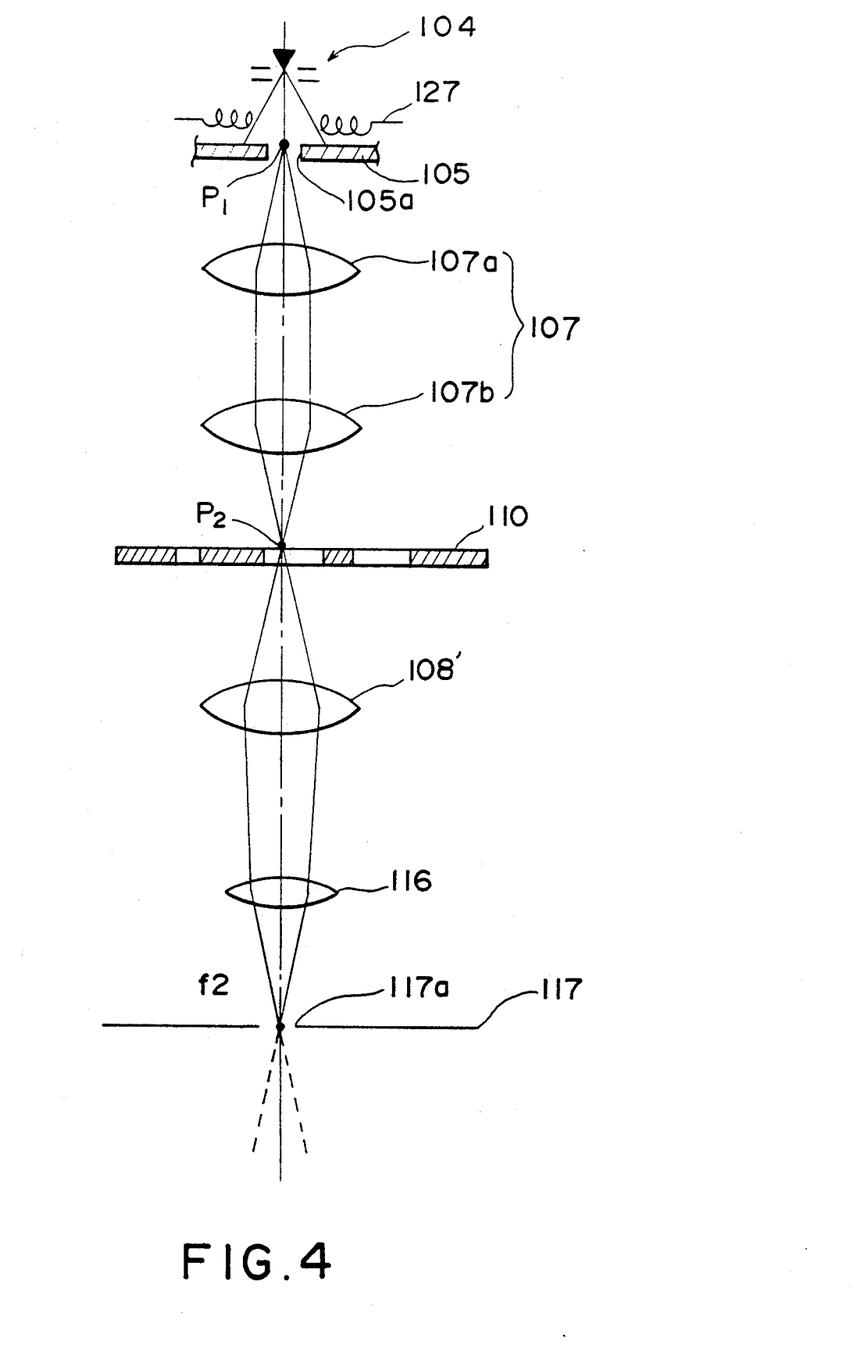
FIG. 4 is a schematic diagram showing the principle of the present invention for focusing the electron beam on an aperture plate.

Next, the principle of the present invention will be described with reference to FIGS. 3 and 4, wherein FIG. 3 shows the conventional case corresponding to FIG. 1 for focusing the image of the aperture in the block mask 110 on the surface of the substrate 123. FIG. 4 on the other hand shows the present invention in which the image of the aperture on the block mask 110 is focused on the blanking aperture plate 117.

Referring to FIG. 3, the electron beam produced by the electron gun 104 and shaped by the shaping aperture 105a is focused on the block mask 110 whereby the rectangular image of the shaping aperture 105a is formed on the block mask 110. The electron beam is then shaped upon passage through the block mask 110 and focused on the surface of the substrate 123 by the lenses 108 and 116 (FIG. 3) as well as by the lenses 119 and 122 (FIG. 1). Thereby, a demagnified image of the aperture in the block mask 110 is formed on the surface of the substrate 123. It should be noted that the demagnifying optical system of the lenses 108 and 116 forms the focal point f1 at a level above the blanking aperture plate 117.

In the present invention, the strength of the electron lens 108 is reduced slightly. This situation is shown in FIG. 4 by a lens 108'. Referring to FIG 4, the focal point f1 of the lens system of lenses 108' and 116 is now moved to a point f2 that is located on the blanking aperture plate 117. Thereby, the image of the pattern in the mask 110 is focused on the upper surface of the aperture plate 117. The present invention detects the image thus formed on the aperture plate for the checking of the pattern of the aperture in the block mask 110.

Figure 5:
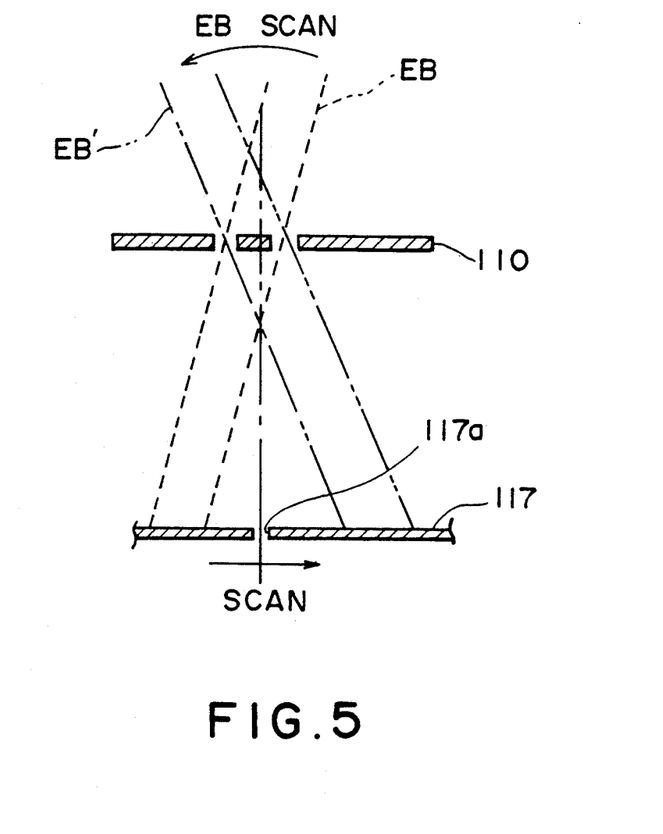
FIG. 5 is a schematic diagram showing a scanning process for reproducing the image of the aperture formed on the block mask.

FIG. 5 shows the principle of the detection of the image on the aperture plate 117. As shown in FIG. 5, the electron beam represented as EB is deflected such that the electron eam EB irradiates a selected pattern on the block mask 110 while being deflected and whereby the angle of the electron beam EB is changed. Thereby, the image of the aperture formed on the aperture plate 117 is moved in response to the deflection of the electron beam EB. Thereby, that part of the image which corresponds to the blanking aperture 117a passes through the aperture plate 117 and reaches the substrate 123. By detecting the passage of the electron be through the aperture 117a of plate 117 in synchronization with the scanning, one can reconstruct the image of the aperture of the block mask 110 that is projected on the aperture plate 117.

Figure 6:
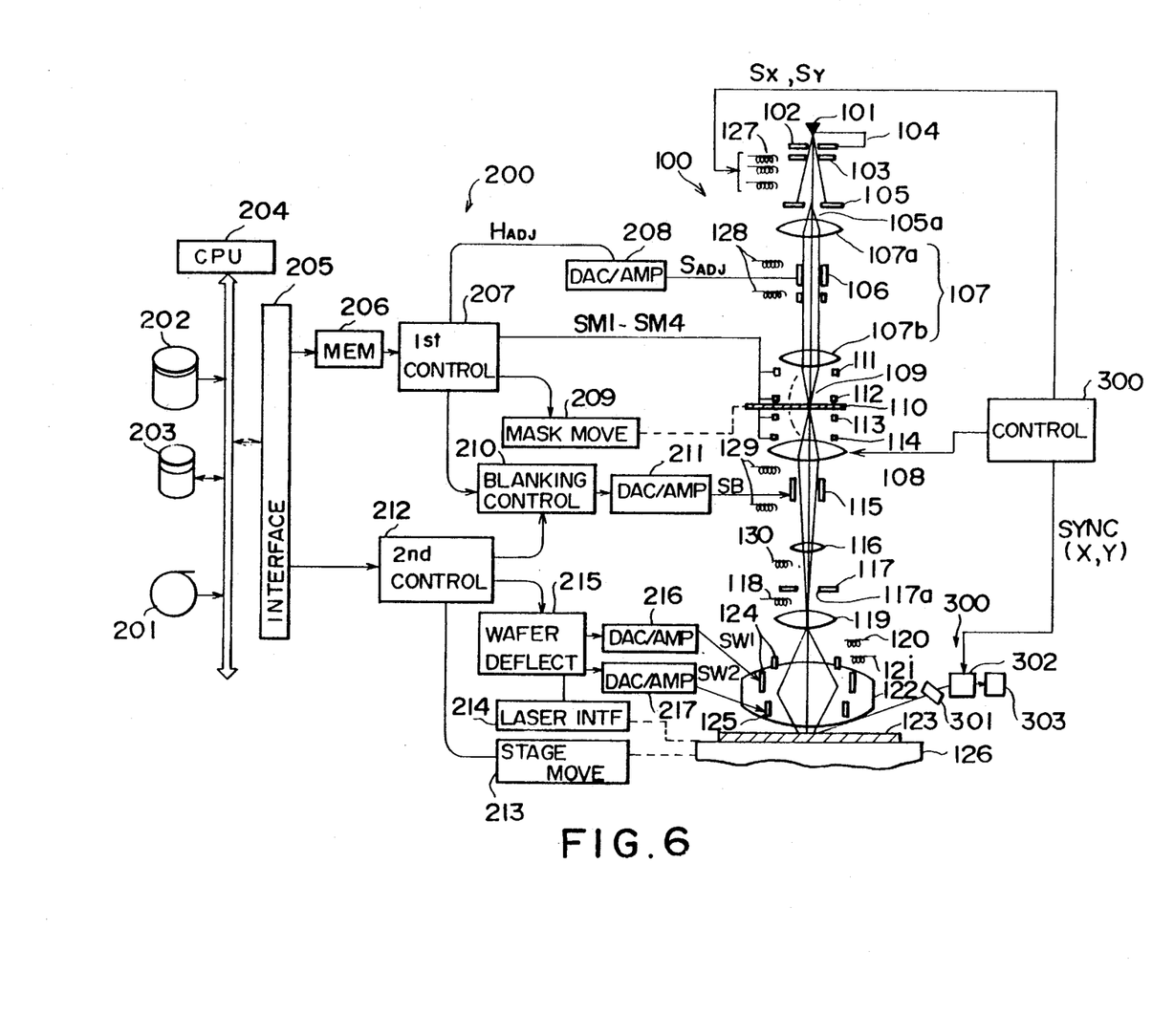
FIG. 6 is a block diagram showing the construction of the electron beam exposure system according to an embodiment of the present invention.

FIG. 6 shows an electron beam exposure system according to an embodiment of the present invention. In FIG. 6, the parts that correspond to those described previously are designated by the same reference numerals and the description will be omitted.

In the present embodiment, a controller 300C is provided for controlling the strength of the electron lens 108 such that the image of the apertures in the block mask 110 is focused on the aperture, plate 117 when conducting the checking of the pattern of each of the apertures in the block mask 110. Further, there is provided a detection system 300D for detecting the arrival of the electron beam on the substrate 123. The detection system 300D includes an electron detector 301 for detecting the back-scattered electrons that are released in response to the irradiation of the incident electron beam, and an image processing unit 302 supplied with an output of the detector 301 for reproducing the image on the aperture plate 117. The image reproduced by the image processing unit 302 is displayed in a display device 303. It will be convenient to use a SEM (scanning electron microscope) unit for the detection system 300.

In order to achieve the foregoing scanning of the image on the aperture plate 117, the controller 300C produces scanning signals Sx and Sy and supplies the same to the alignment coil 127 that is provided adjacent to the electron gun 104 for establishing the alignment of the electron beam. There, the electron beam is deflected and the image on the aperture plate 117 is scanned as shown in FIG. 5. Further, the controller 300C produces a synchronizing signal SYNC and supplies the same to the image processing unit 302. The image processing unit 302 reproduces the image based upon the input signal from the detector 301 that indicates the arrival of the electron beam and the synchronizing signal SYNC indicating the scanning of the electron beam.

Figure 7:
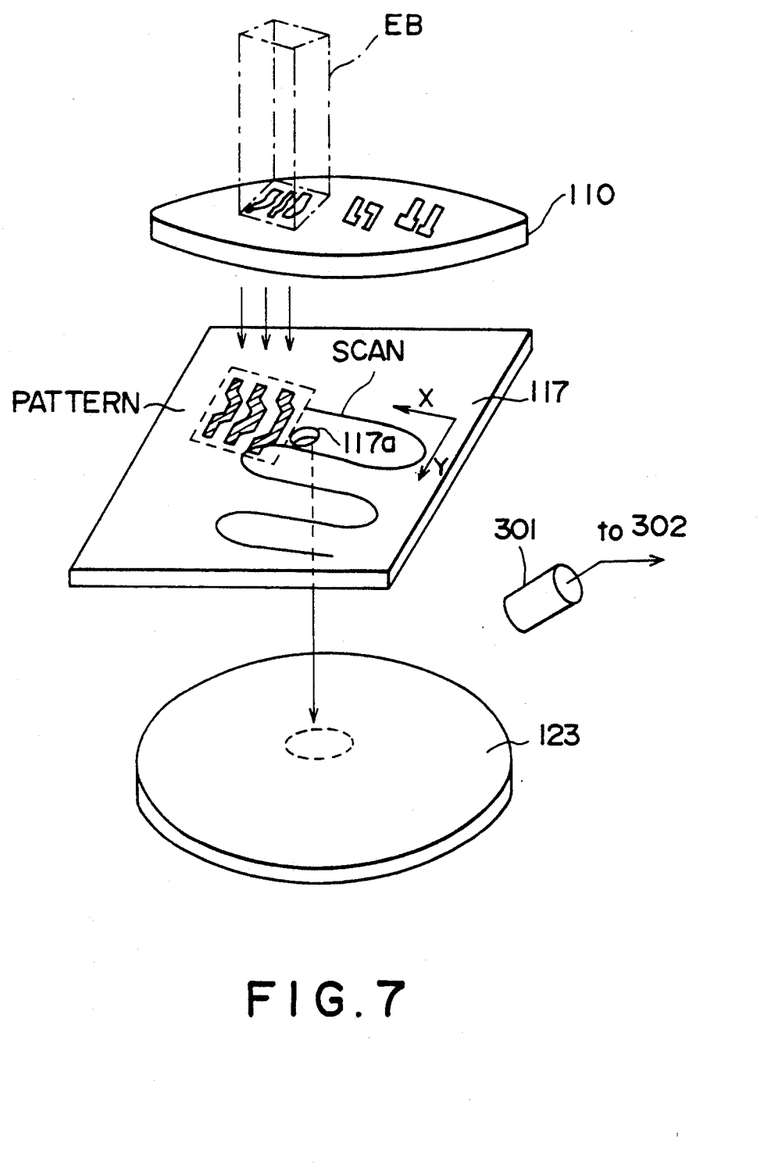
FIG. 7 is a diagram showing the scanning of the image formed on the aperture plate in the system of FIG. 6.

FIG. 7 shows the scanning of the image on the aperture plate 117.

In response to the deflection of the electron beam caused by the scanning signal Sx, the image on the plate 117 is moved for the entire width of the image in a X-direction, while the image is moved in a Y-direction, perpendicular to the X-direction, in response to the scanning signal Sy. Thereby, the X-direction corresponds to the horizontal scanning direction and the Y-direction corresponds to the vertical scanning direction in the usual TV system. In the scanning in the Y-direction, the image is moved with a distance generally corresponding to the diameter of the aperture 117a.

As already described, the electron beam EB that has reached the surface of the substrate 123 is detected by the detector 301. It should be noted that the detector 301 merely detects the arrival or interruption of the electron beam in correspondence to the image of the pattern projected onto the plate 117. Thus, the focusing of the pattern image on the substrate 123 is not achieved nor necessary for the checking of the aperture pattern in the mask 110.

Figure 8:
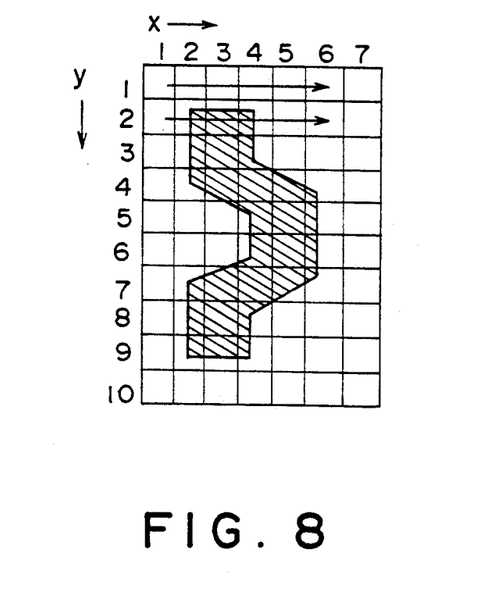
FIG. 8 is a diagram showing the scanning of the image of the aperture on the block mask.

FIG. 8 shows the synthesis of the reproduced image as performed by the image processor 302, based upon the output of the detector 301 and the synchronizing signal SYNC.

Referring to FIG. 8, the level of the output of the detector 301 is detected line sequentially while repeating the scanning in the X-direction. There, the synchronizing signal SYNC includes a synchronizing signal component X in the X-direction and a synchronizing signal component Y in the Y-direction, and the deflection control signal Sx is changed in correspondence to the synchronizing signal component X. After each scanning in the X-direction, the deflection control signal Sy is changed by a predetermined amount and the scanning in the X-direction is repeated. As a result, one can reproduce the image of the aperture pattern on the plate 117 and display the same on the display device 303.

Based upon the image displayed on the display device 303, one can reject the apertures that are determined to be defective, in the subsequent exposure process.

Figure 9A:
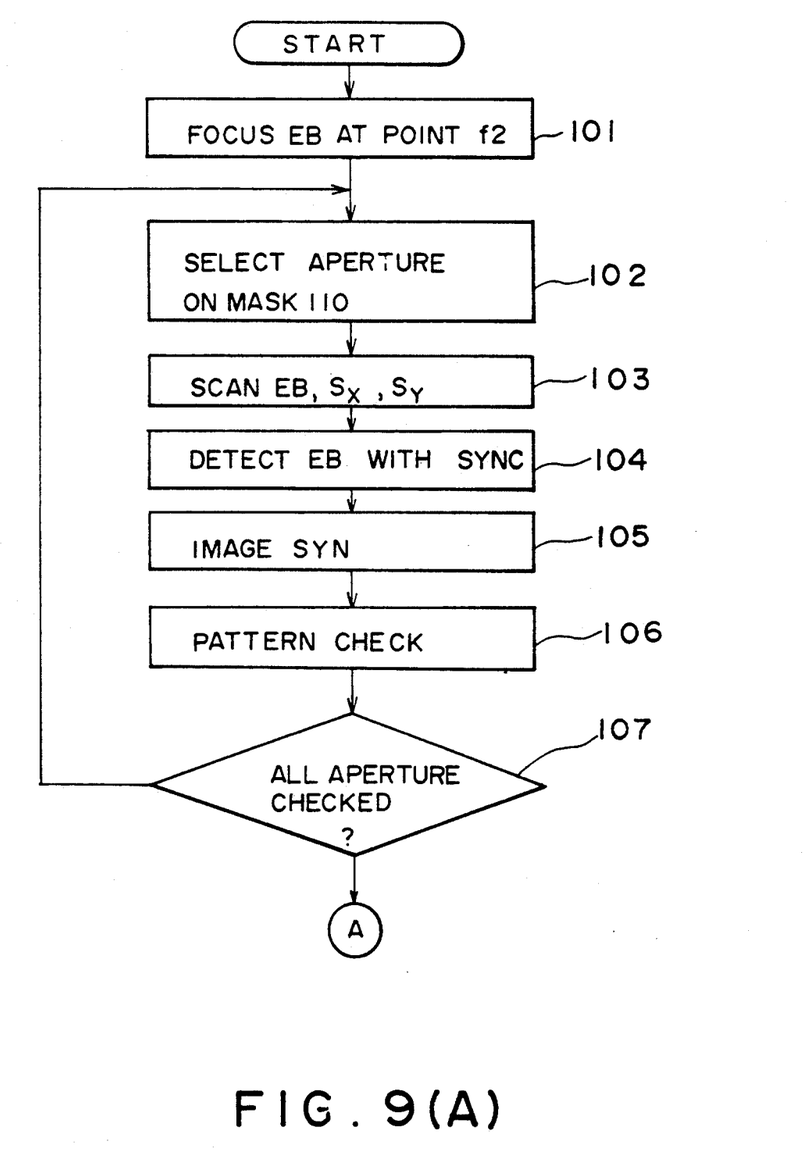
FIGS. 9(A) and 9(B) are flowcharts showing the checking operation and exposure operation achieved by the electron beam exposure system of FIG. 6.
Figure 9B:
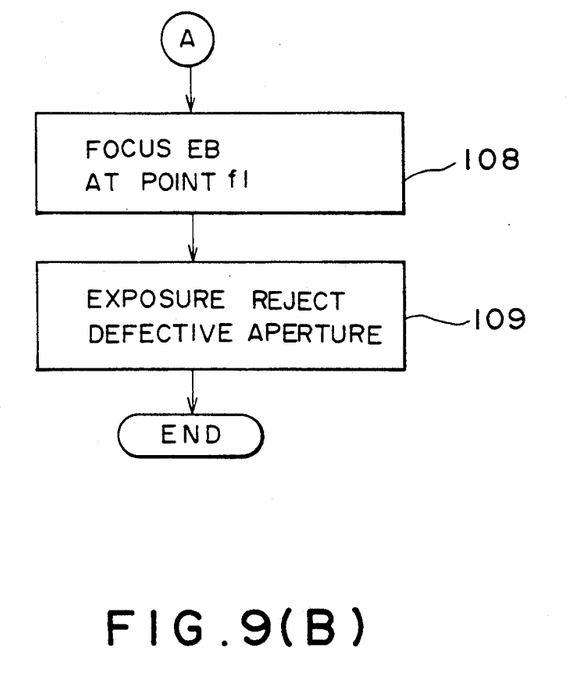

FIGS. 9(A) and 9(B) show a general procedure of operation of the electron beam exposure system of the present invention.

In the first step 101, the controller 300C controls the electron lens 108 such that the electron beam is focused at the point f2 on the aperture plate 117 as shown in FIG. 4.

Next, in the step 102, one of the apertures in the mask 110 is selected by energizing the deflectors 111-114. Further, in the step 103, the electron beam is scanned over the mask 110 by energizing the adjustment coil 127 in response to the drive signals Sx and Sy. Simultaneously, in the step 104, the passage of the electron beam to the substrate 123 is detected by the detecting system 300D in synchronization with the scanning. Further, in the step 105, the image of the pattern on the aperture plate 117 is reproduced based upon the output of the detector 301 and the X and Y synchronizing signals SYNC. Further, in the step 106, the pattern displayed on the display device 303 is checked. If the selected aperture is defective, that aperture is registered.

When all the apertures on the mask 110 are checked in the step 107, the controller 300 sets the electron beam to focus at the point f1. Thereafter, the usual exposure process is achieved in the step 109 except that any addressing of the defective aperture is rejected.

According to the present invention, one can check the pattern of the apertures on the block mask 110 without dismounting the mask from the optical system and various of the problems associated with the dismounting of the block mask 110 for inspection are eliminated. This is particularly true when redundant apertures are formed on the mask 110. Further, the checking of the pattern may be done automatically by conducting a pattern matching.

It should be noted that the detection and reproduction of the image on the aperture plate 117 is not limited to the scanning as described but other means may also be employed.

Figure 10:
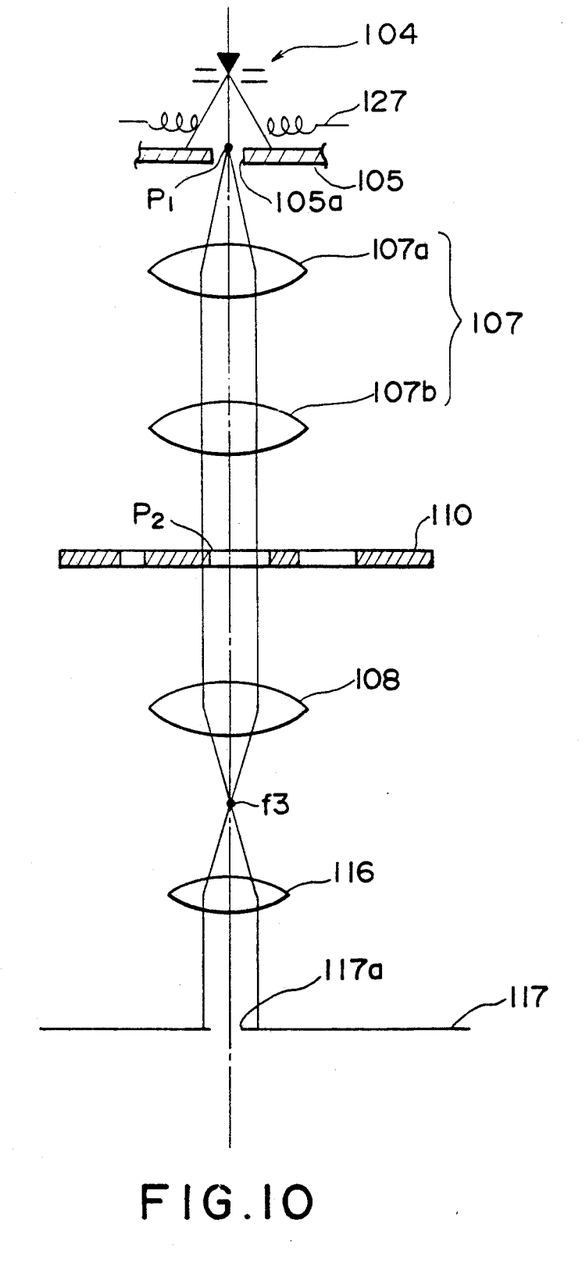
FIG. 10 is a diagram showing another embodiment of the present invention.

FIG. 10 shows another embodiment of the present invention. In FIG. 10, the parts that correspond to the parts of FIG. 4 are designated by the same reference numerals and the description will be omitted.

In the present embodiment, the strength of electron lens 107b is reduced such that the parallel electron beam formed by the electron lens 107a enters straight to the electron lens 108, after passing through the mask 110. Upon passage through the mask 110, the electron beam is shaped according to the shape of the aperture as already described.

The lens 108 is energized with an increased strength, and the election beam is once focused at a point f3 located between the lens 108 and the lens 116. Upon emerging from the lens 116, the electron beam travels as a parallel beam and hits the aperture plate 117. Thereby the shadow of the image of the aperture pattern the mask 110 is projected in the aperture plate 117. By detecting the pattern of the aperture thus projected as already described, one can check the patterns on the mask 110.

Further, the present invention is not limited to the embodiments described heretofore but various variations and modifications may be made without departing from the scope of the invention.

What is claimed is:

1. An electron beam exposure system for writing a pattern on an object, said electron beam exposure system having a capability of checking the pattern to be written on the object, comprising;

electron beam source means for producing an electron beam such that the electron beam ravels along an optical axis that extends from the electron beam source means to the object;

beam shaping means provided on the optical axis of the electron beam for shaping the electron beam such that the electron beam has a desired cross section, said beam shaping means having at least one selectable aperture pattern for passing the electron beam thee-through and thereby shaping same;

focusing means, provided along the optical axis between the beam shaping means and the object, selectively operable for focusing the electron beam, as shaped by as elected aperture pattern of the beam shaping means, on the object and such that an imaged of the selected aperture pattern of the beam shaping means, through which the electron beam has passed, is written on the object;

a screen, provided along the optical axis between the beam shaping means and the object, having an upper major surfaces for interrupting the electron beam when the electron beam is offset from the optical axis and further having a through-hole in alignment with the optical axis for passing the electron beam therethrough;

control means for controlling the focusing means, selectively, to project an image of a selected aperture pattern of the beam shaping means, through which the electron beam has passed, onto the upper major surface of said screen when checking the selected aperture pattern of the beam shaping means; and detection means for detecting the image of the selected aperture pattern that a is projected on the screen.

2. An electron beam exposure system as claimed in claim 1 in which said detection means comprises defection means for deflecting the electron beam such that the image projected on said screen is moved over the upper major surface of the screen with respect to the aperture formed on the screen, a detector for detecting the arrival of the electron beam on said object through the through-hole formed in the screen and producing a corresponding output, and an image synthesis circuit supplied with the output of the detector for reproducing the image projected on the screen in synchronization with the movement of the image over the upper major surface of the screen.

3. An electron beam exposure system as claimed in claim 1 in which said control means supplies a drive signal to said deflection means for effective the movement of the image over the upper major surface of the said screen, said control means further producing a synchronizing signal simultaneously with said drive signal and supplying the same o the image synthesis circuit, and said image synthesis circuit reproducing the image as projected on the upper major surface of the screen from the output of the detector in synchronization with said synchronizing signal.

4. An electron beam exposure system as claimed in claim 3 in which said control means produces said drive signal as a first deflection control signal and a second deflection control signal, said first deflection control signal causing the movement of the image over the upper major surface of the screen in a first direction and said second deflection control signal causing the movement of the image over the upper major surface of the screen in a second direction perpendicular to said first direction, and said control means further produces said synchronizing signal as a first synchronizing signal and a second synchronizing signal, said first synchronizing signal being produced in synchronization with said first deflection control signal and said second synchronizing signal being produced in synchronization with said second deflection control signal.

5. An electron beam exposure system as claimed in claim 4 in which said control means alternatively produces said first deflection control signal and said second deflection control signal such that each first deflection control signal causes the movement of the image on the screen in the first direction from one end to the opposite end of the image, and such that each second deflection control signal caused the movement of the image on the screen in the second direction for a distance corresponding to the diameter of the through-hole on the screen.

6. An electron beam exposure system as claimed in claim 1 in which said focusing means comprises an electron lens provided on the optical axis between the beam shaping means and the screen as a demagnifying electron optical system having a selectively variable strength, said electron lens being activated with a strength determined by a drive signal supplied thereto from the control means, said control means providing a drive signal for reducing the strength of the electron lens when checking the pattern of each selected aperture of the beam shaping means.

7. A method for checking a pattern to be written on an object in an electron beam exposure system by an electron beam, comprising the steps of:
    producing an electron beam along an optical axis extending from an electron beam source to said object;
    passing the electron beam through an aperture provided along the optical axis to shape the electron beam according to the pattern of the aperture;
    projecting the electron beam on a screen provided on said optical axis, at a position axially offset from he axial position of the object, thereby to project an image, corresponding to the pattern of the aperture, on the screen; and
    detecting the image thus projected on the screen.

8. A method as claimed in claim 7 in which said step of detecting the image comprises the steps of moving the image, line consecutively, on said screen by deflecting the electron beam such that a part of the image is passed through a hole provided on the screen, detecting the passage of the electron beam through the hole on the screen, and synthesizing the image on the screen based on the result of detection of the electron eam in synchronization with the movement of the image on the screen.

9. A method for writing a pattern on an object, comprising the steps of:
    producing an electron beam along an optical axis from an electron beam source to an object;
    passing the electron beam through an aperture provided along the optical axis for shaping the electron beam according to the pattern of the aperture;
    for checking aperture pattern, selectively projecting the electron beam on a screen provided on aid optical axis, at a position axially offset form the axial position of the object, thereby to project an image, corresponding to the pattern of the aperture, on the screen and detecting the image thus projected on the screen; and
    for writing the pattern on the object, selectively focusing the electron ea, and thereby an image of the aperture pattern, on said object.

* * * * *

UNITED STATES PATENT AND TRADEMARK OFFICE
CERTIFICATE OF CORRECTION

PATENT NO.  : 5,180,919
DATED       : Jan. 19, 1993
INVENTOR(S) : OAE et al.

Page 1 of 2

It is certified that error appears in the above-indentified patent and that said Letters Patent is hereby corrected as shown below:

On title page,
    item, [57] ABSTRACT: line 18, after "therethrough" insert --,--.

Col. 1,   line 27, after "of" (first occurrence) insert --several, selectable--;
           line 28, delete "several, selectable".

Col. 3,   line 45, change "sam" to --same--.

Col. 5,   line 30, delete "lens";
           line 61, delete ",".

Col. 7,   line 1, after "117" insert --,--;
           line 21, change "any" to --the;
           line 22, change "the" to --any--;
           line 53, after "pattern" insert --on--;
           line 68, change "ravels" to --travels--.

Col. 8,   line 8, change "thee-through" to --therethrough--;
           line 12, change "as elected" to --a selected--;
           line 14, change "imaged" to --image--;
           line 19, change "surfaces" to --surface--;
           line 32, delete "a";
           line 35, change "defection" to --deflection--;
           line 49, change "effective" to --effecting--;
           line 53, change "same o" to --same to--.

Col. 9,   line 14, change "caused" to --causes--.

UNITED STATES PATENT AND TRADEMARK OFFICE
CERTIFICATE OF CORRECTION

PATENT NO. : 5,180,919

DATED : Jan. 19, 1993

INVENTOR(S) : OAE et al.

Page 2 of 2

It is certified that error appears in the above-indentified patent and that said Letters Patent is hereby corrected as shown below:

Col. 10, line 5, change "he" to --the--;
line 17, change "eam" to --beam--;
line 28, change "aid" to --said--.

Signed and Sealed this

Sixteenth Day of August, 1994

Attest:

BRUCE LEHMAN

Attesting Officer

Commissioner of Patents and Trademarks